(12) United States Patent
Saga et al.

(10) Patent No.: US 6,469,253 B1
(45) Date of Patent: *Oct. 22, 2002

(54) OXIDE SUPERCONDUCTING WIRE WITH STABILIZING METAL HAVE NONE NOBLE COMPONENT

(75) Inventors: Nobuhiro Saga, Osaka (JP); Kazuhiko Hayashi, Osaka (JP); Kenichi Sato, Osaka (JP)

(73) Assignees: Sumitomo Electric Industries, Ltd (JP); Japan Science and Technology Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/632,229

(22) Filed: Apr. 15, 1996

(30) Foreign Application Priority Data

Oct. 17, 1995 (JP) .............................................. 7-268810

(51) Int. Cl.[7] .............................................. H01B 12/00
(52) U.S. Cl. .................... 174/125.1; 505/236; 505/237; 505/231
(58) Field of Search ....................... 174/125.1; 505/230, 505/231, 884, 236, 237, 704, 813, 886, 887

(56) References Cited

U.S. PATENT DOCUMENTS 5,017,533 A * 5/1991 Whitlow et al. ............ 505/231

FOREIGN PATENT DOCUMENTS

| EP | 0 499 049 A1 | 8/1992 |
| EP | 0 509 436 A2 | 10/1992 |
| EP | 0 554 681 A1 | 8/1993 |
| EP | 0 661 762 A1 | 7/1995 |
| EP | 0 736 914 A1 | 10/1996 |
| JP | 2-8335 | 1/1990 |
| JP | 4-94014 | * 3/1992 |
| JP | 5-62534 | * 3/1993 |
| JP | 6-283056 | * 10/1994 |
| WO | WO 96/28853 | 9/1996 |

OTHER PUBLICATIONS

Patent Abstracts of Japan, JP 07 122124, vol. 95, No. 005, Dec. 5, 1995.
Patent Abstracts of Japan, JP 07 122126, vol. 95, No. 005, Jul. 5, 1995.
Summary of General Lectures at Autumn Meeting of the Japan Institute of Metals, Oct. 1987, p. 236.

* cited by examiner

*Primary Examiner*—Kamand Cuneo
(74) *Attorney, Agent, or Firm*—Pennie & Edmonds LLP (57) ABSTRACT

The present invention relates to an oxide superconducting wire. The wire has a filament made essentially of an oxide superconductor, and a stabilizing metal covering the oxide superconductor. The stabilizing metal includes a silver alloy having at least either higher mechanical strength or higher specific electrical resistance than that of silver. In one embodiment, the stabilizing metal further includes a first portion directly covering the oxide superconductor and a second portion covering the first portion. The first portion is adapted to prevent the component of the second portion from diffusing into and reacting with the oxide superconductor. The first and second portions have different materials, and the first portion is made essentially of an Ag—Sb alloy. In another embodiment, the stabilizing metal further has a first portion directly covering the oxide superconductor, a second portion covering the first portion and a third portion covering the second portion. The first portion is made essentially of silver or Ag—Sb alloy. The second portion is made essentially of silver or Ag—Sb alloy. The third portion has a different material with respect to the second portion.

8 Claims, 3 Drawing Sheets

TENSILE STRESS RESISTANCE OF
SILVER ALLOY SHEATH WIRE

FIG. 4

OXIDE SUPERCONDUCTING WIRE WITH STABILIZING METAL HAVE NONE NOBLE COMPONENT

BACKGROUND OF THE INVENTION

1. Field of the Invention

The present invention relates to an oxide superconducting wire having a sheath of high strength and/or high resistance and a method of preparing the same, and more particularly, it relates to a technique for attaining improvement in critical current density of a bismuth based oxide superconducting wire and providing a wire which is advantageously applied to a high magnetic field coil, a current lead, or ac application.

2. Description of the Background Art

In recent years, oxide superconducting materials are watched with interest as superconducting materials exhibiting higher critical temperatures. For example, it is known that bismuth based oxide superconducting materials include those having critical temperatures of 110 K and 80 K, as phases exhibiting high critical temperatures. It is also known that the 110 K phase has a 2223 composition in a Bi—Sr—Ca—Cu system or a Bi—Pb—Sr—Ca—Cu system partially replacing Bi with Pb, while the 80 K phase has a 2212 composition in a similar system.

In relation to a method of preparing an oxide superconductor, there is a method of charging powder of an oxide superconductor or raw material therefor into a metal sheath and performing plastic working and a heat treatment thereto. Due to this process, the powder which is charged in the metal sheath is sintered to form a superconductor. This method is called a powder-in-tube method, and advantageously applied to preparation of a long superconducting wire, for example. The obtained wire can be applied to a power cable or a coil.

In the powder-in-tube method, the sheath which is charged with the powder is subjected to plastic working such as wire drawing and rolling. When the sheath is prepared from pure silver, ideal compressive force cannot be applied to the powder in single plastic working, due to the relatively low strength of silver. When a wire prepared from the sheath of pure silver is heat treated for sintering the oxide superconductor, a temperature which is higher than the softening temperature of silver is employed and hence the strength of silver is reduced after the sintering. Therefore, excessive distortion is readily applied when the obtained wire is handled or coiled, leading to deterioration of superconductivity such as the critical current density.

Japanese Patent Laying-Open No. 2-8335 (1990) discloses a sheath for preparing an oxide superconducting wire which consists of a pipe of an Ag alloy containing 1 to 10 at. % of Mn. Such an alloy is higher in hardness than Ag. This gazette describes that the sheath which is formed by the pipe of an Ag alloy containing 1 to 10 at. % of Mn can be reduced in thickness as compared with an Ag sheath, and hence wire drawing is simplified and oxygen deficiency of the oxide superconductor can be readily recovered. The gazette also describes that the sheath is suitable as that for a drawing method of applying intermediate annealing of 100 to 300° C. every time sectional compressibility reaches 2 to 50. However, the sheath containing Mn in such high concentration is unsuitable for a process requiring a heat treatment at a high temperature of 840 to 850° C., due to extreme reaction with the superconductor.

Summary of General Lectures at Autumn Meeting of the Japan Institute of Metals, October 1987, p. 236 also discloses sheath materials of Ag—2 at. % Mn and Ag—5 at. % Mn in the powder-in-tube method for a Y—Ba—Cu—O system. However, these sheaths are also unsuitable for the heat treatment at 840 to 850° C. Particularly in preparation of bismuth based oxide superconducting wires, it is difficult to attain high critical current densities with these sheaths.

When the wire employing an oxide superconductor is applied to a current lead of a superconducting magnet employing liquid helium as a refrigerant, it is desirable to sufficiently suppress the amount of heat penetration through the current lead. However, the wire which is formed by the silver sheath has a large amount of heat penetration through silver having high heat conductivity, and improvement of this point is awaited.

When the superconducting wire is energized with a direct current which is lower than its critical current density, substantially no loss is caused. When the superconducting wire is energized with an alternating current, however, loss is caused even if the current is below the critical current density. Particularly in the silver sheath wire, it is necessary to reduce eddy current loss and coupling loss which is caused in the sheath portion.

SUMMARY OF THE INVENTION

In order to solve the aforementioned problems in the oxide superconducting wire which is formed by the powder-in-tube method, an object of the present invention is to provide a wire having the following characteristics:

(1) The oxide superconductor is held in a sheath at a higher density.
(2) The wire exhibits a high critical current density (Jc).
(3) The superconducting property such as the critical current density is hardly reduced by bending strain, stress in handling, hoop stress in application to a coil, and the like.
(4) The wire has a small amount of heat penetration upon application to a current lead.
(5) The wire has small ac loss.

The wire according to the present invention is an oxide superconducting wire obtained by performing plastic working and sintering on a sheath, consisting essentially of a stabilizing metal, which is charged with raw material powder capable of forming an oxide superconductor by sintering, and comprises a filament consisting essentially of the oxide superconductor and the stabilizing metal covering the same. In this wire, the stabilizing metal includes such a silver alloy that at least either mechanical strength or specific resistance is higher than that of silver. This wire has a critical temperature of at least 100 K and a critical current density (at 77 K and 0 T) of at least $10^4$ A/cm$^2$, with a yield point of at least 5 kg/mm$^2$ at the room temperature in a tensile test.

According to the present invention, the wire has the critical temperature of at least 100 K, preferably at least 105 K, and the critical current density (at 77 K and 0 T) of at least $10^4$ A/cm$^2$, preferably at least 20,000 A/cm$^2$, with the yield point of at least 5 kg/mm$^2$, preferably at least 10 kg/mm$^2$, at the room temperature in the tensile test. When the sheath of the stabilizing. metal includes that of an Ag—Mn alloy containing at least 0.01 at. % and less than 1 at. % of Mn and/or an Ag—Au—Mn alloy containing at least 1 at. % and not more than 30 at. % of Au and at least 0.01 at. % and less than 1 at. % of Mn, for example, the wire according to the present invention can be provided with specific resistance of at least 0.60 $\mu\Omega$·cm at a temperature immediately above the critical temperature. The specific resistance of the wire can be increased also when a silver alloy containing a metal selected from the group consisting of Sb, Pb and Bi is employed in accordance with the present invention. According to the present invention, the specific resistance at the temperature immediately above the critical temperature can be defined as specific resistance at such a temperature that electric resistance deviates from the linear region and abruptly starts to reduce when temperature change of the electric resistance is measured, while the yield point at the room temperature in the tensile test can readily be defined since an obvious yield phenomenon is recognized in the tensile test. Ac loss and the amount of heat penetration in the case of employing the inventive wire as a current lead can be reduced by improving the specific resistance at the temperature immediately above the critical temperature. If the yield point in the tensile test is less than 5 kg/mm², however, the density of the oxide superconductor is not remarkably improved in the sheath, and improvement of the mechanical strength against bending distortion and stress in handling is not remarkable either. The silver alloy employed for the stabilizing metal sheath for improving the mechanical strength and/or the specific resistance is described later in detail.

In another aspect of the present invention, the oxide superconducting wire according to the present invention is obtained by performing plastic working and sintering on a sheath, consisting essentially of a stabilizing metal, which is charged with raw material powder capable of forming an oxide superconductor by sintering, and comprises a filament consisting essentially of the oxide superconductor and the stabilizing metal covering the same. The stabilizing metal includes such a silver alloy that at least either mechanical strength or specific resistance is higher than that of silver. Further, this stabilizing metal comprises a first portion directly covering the filament and a second portion covering the first portion, and the first portion is adapted to prevent the component of the second portion from diffusing into and reacting with the oxide superconductor. Due to such a structure, a wire having a critical temperature of at least 100 K and a critical current density (at 77 K and 0 T) of at least $10^4$ A/cm² with a yield point of at least 5 kg/mm² at the room temperature in a tensile test can be provided.

In still another aspect, the oxide superconducting wire according to the present invention is an oxide superconducting wire obtained by performing plastic working and sintering on a sheath, consisting essentially of a stabilizing metal, which is charged with raw material powder capable of forming an oxide superconductor by sintering, and comprises a plurality of filaments consisting essentially of the oxide superconductor and the stabilizing metal covering the same. The stabilizing metal includes a silver alloy having higher mechanical strength and specific resistance than silver, and comprises a first portion directly covering the filaments and a second portion covering the first portion, while the first portion consists essentially of a silver alloy having higher specific resistance than silver for reducing ac loss which is caused across the plurality of filaments. Due to such a structure, a wire having a critical temperature of at least 100 K and a critical current density (at 77 K and 0 T) of at least $10^4$ A/cm² with a yield point of at least 5 kg/mm² at the room temperature in a tensile test can be provided.

A method of preparing an oxide superconducting wire is provided according to the present invention. This method comprises a step of performing plastic working and sintering on a stabilizing metal sheath which is charged with raw material powder capable of forming an oxide superconductor by sintering. In such a method, the stabilizing metal sheath is prepared from a silver alloy which is selected from the group consisting of the following alloys (a) to (h). When the stabilizing metal sheath is prepared from a silver alloy containing Mn in this method, the sintering step is preferably carried out under an atmosphere containing oxygen at a partial pressure of at least 0.01 atm. at a temperature of not more than 850° C. If the stabilizing metal sheath is prepared from a silver alloy containing a metal selected from the group consisting of Sb, Pb and Bi, on the other hand, the sintering step is preferably carried out under an atmosphere containing oxygen at a partial pressure of not more than 0.08 atm. at a temperature of not more than 850° C.

(a) An Ag—Mn alloy containing at least 0.01 at. % and less than 1 at. % of Mn;

(b) an Ag—Au—Mn alloy containing at least 1 at. % and not more than 30 at. % of Au and at least 0.01 at. % and less than 1 at. % of Mn;

(c) an Ag—Sb alloy containing at least 0.01 at. % and not more than 5 at. % of Sb;

(d) an Ag—Au—Sb alloy containing at least 1 at. % and not more than 30 at. % of Au and at least 0.01 at. % and not more than 5 at. % of Sb;

(e) an Ag—Pb alloy containing at least 0.01 at. % and not more than 3 at. % of Pb;

(f) an Ag—Au—Pb alloy containing at least 1 at. % and not more than 30 at. % of Au and at least 0.01 at. % and not more than 3 at. % of Pb;

(g) an Ag—Au—Bi alloy containing at least 1 at. % and not more than 30 at. % of Au and at least 0.01 at. % and not more than 3 at. % of Bi; and (h) an Ag—Bi alloy containing at least 0.01 at. % and not more than 3 at. % of Bi.

Another method of preparing a multifilamentary oxide superconducting wire is provided according to the present invention. This method comprises the steps of charging a first stabilizing metal sheath with raw material powder capable of forming an oxide superconductor by sintering and performing plastic working thereon for obtaining a strand, engaging a plurality of such strands in a second stabilizing metal sheath and then performing plastic working thereon for obtaining a multifilamentary wire, and heat treating the multifilamentary wire for obtaining a sintered body of the oxide superconductor. According to this method, the first stabilizing metal sheath is prepared from a material which is selected from the group consisting of Ag, an Ag—Zr alloy, an Ag—Ti alloy, an Ag—Au alloy and the aforementioned alloys (a) to (h). On the other hand, the second stabilizing metal sheath is prepared from a material which is selected from the group consisting of Ag, an Ag—Mg alloy, an Ag—Ni alloy, an Ag—Mg—Ni alloy, an Ag—Zr alloy and the aforementioned alloys (a) to (h). At least either the first or second stabilizing metal sheath is prepared from a silver alloy selected from the aforementioned groups. Therefore, not both of the first and second stabilizing metal sheaths consist essentially of silver. When either stabilizing metal sheath is prepared from a silver alloy containing Mn in this method, the heat treatment step is preferably carried out under an atmosphere containing oxygen at a partial pressure of at least 0.01 atm. at a temperature of not more than 850° C. When either stabilizing metal sheath is prepared from a silver alloy containing a metal selected from the group consisting of Sb, Pb and Bi, on the other hand, the heat treatment step is preferably carried out under an atmosphere containing oxygen at a partial pressure of not more than 0.08 atm. at a temperature of not more than 850° C. Additionally, the second stabilizing metal sheath may be prepared from an Ag—Mn alloy containing Mn in the range of 1 at. % to 5 at. %.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A wire according to the present invention includes a tape-shaped oxide superconducting single-filamentary or multifilamentary wire having (a) filament(s), consisting essentially of an oxide superconductor, embedded in a stabilizing material. The oxide superconductor includes a yttrium, bismuth or thallium based oxide superconductor, for example. The present invention is particularly preferably applicable to a bismuth based ceramics superconductor. The wire according to the present invention is prepared through a process of firing and pulverizing raw material powder for the oxide superconductor, charging the powder into a stabilizing material sheath, and performing plastic working and sintering. In preparation of the raw material powder, powder materials of oxides or carbonates of elements forming a superconductor are mixed with each other at prescribed blending ratios and sintered, so that the sintered substance is thereafter pulverized to obtain the raw material powder. The sheath which is charged with the powder can be made of a silver alloy, as described later. The plastic working is performed by drawing, rolling and the like. After the rolling, the wire which is worked into the form of a tape is sintered at a temperature of about 800° C. to about 850° C., preferably about 840° C. to 850° C., so that the superconductor provided in the sheath attains high orientation and a high critical current density. In preparation of a multifilamentary wire, a plurality of wires obtained after the drawing are engaged and subjected to plastic working and sintering. In the aforementioned process, a substantially single superconducting phase having high orientation can be formed by the combination of the plastic working and the sintering. A filament of the tape-shaped superconducting wire prepared through this process has a substantially homogeneous superconducting phase over the longitudinal direction of the tape-shaped wire, and the c-axis of the superconducting phase is oriented substantially in parallel with the thickness direction of the tape wire. The crystal grains forming the filament, which are in the form of flakes extending in the longitudinal direction of the tape wire, are strongly bonded with each other. The flaky crystal grains are stacked in the thickness direction of the tape wire. The tape-shaped superconducting wire, which is not particularly restricted in size, is 1.0 mm to 10 mm, preferably 2 mm to 6 mm in width, and 0.05 mm to 1 mm, preferably 0.1 mm to 0.4 mm in thickness, for example.

The following alloys (A) to (H) can be listed as examples of a preferable silver alloy for forming the stabilizing metal in the oxide superconducting wire according to the present invention:

(A) An Ag—Mn alloy containing at least 0.01 at. % and less than 1 at. % of Mn in which a part of Mn is deposited in the solid solution as oxide particles;

(B) an Ag—Au—Mn alloy containing at least 1 at. % and not more than 30 at. % of Au and at least 0.01 at. % and less than 1 at. % of Mn in which a part of Mn is deposited in the solid solution as oxide particles;

(C) an Ag—Sb alloy containing at least 0.01 at. % and not more than 5 at. % of Sb in which a part of Sb is deposited in the solid solution as oxide particles;

(D) An Ag—Au—Sb alloy containing at least 1 at. % and not more than 30 at. % of Au and at least 0.01 at. % and not more than 5 at. % of Sb in which a part of Sb is deposited in the solid solution as oxide particles;

(E) an Ag—Pb alloy containing at least 0.01 at. % and not more than 3 at. % of Pb in which a part of Pb is deposited in the solid solution as oxide particles;

(F) an Ag—Au—Pb alloy containing at least 1 at. % and not more than 30 at. % of Au and at least 0.01 at. % and not more than 3 at. % of Pb in which a part of Pb is deposited in the solid solution as oxide particles;

(G) an Ag—Au—Bi alloy containing at least 1 at. % and not more than 30 at. % of Au and at least 0.01 at. % and not more than 3 at. % of Bi in which a part of Bi is deposited in the solid solution as oxide particles; and (H) an Ag—Bi alloy containing at least 0.01 at. % and not more than 3 at. % of Bi in which a part of Bi is deposited in the solid solution as oxide particles.

The respective silver alloys are now described in more detail.

According to the present invention, the silver alloy for the stabilizing metal having higher mechanical strength and specific resistance than silver can be prepared from the Ag—Mn alloy containing at least 0.01 at. % and less than 1 at. % of Mn in which a part of Mn is deposited as oxide particles. The silver alloy which is mainly composed of the solid solution of Ag and Mn has high strength. When Mn is partially deposited as oxide particles, the strength is further increased. Mn may be previously oxidized, or can alternatively be oxidized during the steps of preparing the wire. In this case, Mn is partially maintained in the solid solution state, which effectively improves the specific resistance. If the Mn concentration is less than 0.01 at. % in this silver alloy, characteristics such as high mechanical strength and specific resistance cannot be improved at desire. If the Mn concentration is in excess of 1 at. %, on the other hand, reaction between Mn and the superconductor is so remarkable in the wire preparation process that no wire having excellent critical temperature and critical current density can be obtained.

The silver alloy can be prepared from the Ag—Au—Mn alloy containing at least 1 at. % and not more than 30 at. % of Au and at least 0.01 at. % and less than 1 at. % of Mn in which a part of Mn is deposited as oxide particles. The silver alloy which is mainly composed of the solid solution has high mechanical strength. In this silver alloy, the Mn concentration is set in the range of 0.01 to 1 at. %, for the aforementioned reason. This alloy can bring further increase in electric resistance, due to the addition of Au. If the amount of Au is less than 1 at. %, however, it is difficult to bring further remarkable increase in the electric resistance. In consideration of the cost and the attainable effect, the Au concentration is preferably up to 30 at. %.

The silver alloy can preferably be prepared from the Ag—Sb alloy containing at least 0.01 at. % and not more than 5 at. % of Sb in which Sb is at least partially (partially or entirely) deposited as oxide particles. Sb, which is lower in reactivity with the oxide superconductor as compared with Mn, can further improve the specific resistance of the sheath. The silver alloy which is mainly composed of a solid solution of Ag and Sb has high strength. When Sb is at least partially deposited as oxide particles, the strength is further improved. Sb may be previously oxidized, or can alternatively be oxidized during steps of preparing the wire. In this case, the solid solution state in which at least a part of Sb is maintained effectively improves the specific resistance. In order to improve the specific resistance, the solid solution state is preferably sufficiently maintained. If the Sb concentration is less than 0.01 at. % in this silver alloy, however, characteristics such as high mechanical strength and specific resistance cannot be improved at desire. If the Sb concentration is in excess of 5 at. %, on the other hand, reaction between Sb and the superconductor is so remarkable in the wire preparation process that no wire having excellent critical temperature and critical current density can be obtained.

The silver alloy can preferably be prepared from the Ag—Au—Sb alloy containing at least 1 at. % and not more than 30 at. % of Au and at least 0.01 at. % and not more than 5 at. % of Sb in which Sb is at least partially (partially or entirely) deposited as oxide particles. The silver alloy which is mainly composed of the solid solution has high mechanical strength. In this silver alloy, the Sb concentration is set in the range of 0.01 to 5 at. %, for the aforementioned reason. This silver alloy can bring further increase in electric resistance, due to the addition of Au. If the amount of Au is less than 1 at. %, however, it is difficult to bring further remarkable increase in the electric resistance. In consideration of the cost and the attainable effect, on the other hand, the Au concentration is preferably up to 30 at. %.

The silver alloy can preferably be prepared from the Ag—Pb alloy containing at least 0.01 at. % and not more than 3 at. % of Pb in which Pb is at least partially (partially or entirely) deposited as oxide particles. The silver alloy which is mainly composed of the solid solution of Ag and Pb has high strength. When Pb is at least partially deposited as oxide particles, higher strength can be attained. Pb may be previously oxidized, or can alternatively be oxidized during the steps of preparing the wire. In this case, the solid solution state in which at least a part of Pb is maintained effectively improves the specific resistance. In order to improve the specific resistance, the solid solution state is preferably sufficiently maintained. If the Pb concentration is less than 0.01 at. % in this silver alloy, however, characteristics such as high mechanical strength and specific resistance cannot be improved at desire. If the Pb concentration is in excess of 3 at. %, on the other hand, reaction between Pb and the superconductor is so remarkable in the wire preparation process that no wire having excellent critical temperature and critical current density can be obtained.

The silver alloy can preferably be prepared from the Ag—Au—Pb alloy containing at least 1 at. % and not more than 30 at. % of Au and at least 0.01 at. % and not more than 3 at. % of Pb in which Pb is at least partially (partially or entirely) deposited as oxide particles. The silver alloy which is mainly composed of the solid solution has high mechanical strength. In this silver alloy, the Pb concentration is set in the range of 0.01 to 3 at. %, for the aforementioned reason. This silver alloy can bring further increase in the electric resistance, due to the addition of Au. If the amount of Au is less than 1 at. %, however, it is difficult to bring further remarkable increase in the electric resistance. In consideration of the cost and the attainable effect, on the other hand, the Au concentration is preferably up to 30 at. %.

The silver alloy can preferably be prepared from the Ag—Bi alloy containing at least 0.01 at. % and not more than 3 at. % of Bi in which Bi is at least partially (partially or entirely) deposited as oxide particles. The silver alloy which is mainly composed of the solid solution of Ag and Bi has high strength. When Bi is at least partially deposited as oxide particles, the strength is further improved. Bi may be previously oxidized, or can alternatively be oxidized during steps of preparing the wire. In this case, the solid solution state in which at least a part of Bi is maintained effectively improves the specific resistance. In order to improve the specific resistance, the solid solution state is preferably sufficiently maintained. If the Bi concentration is less than 0.01 at. % in this silver alloy, however, characteristics such as high mechanical strength and specific resistance cannot be improved at desire. If the Bi concentration is in excess of 3 at. %, on the other hand, reaction between Bi and the superconductor is so remarkable in the wire preparation process that no wire having excellent critical temperature and critical current density can be obtained.

The silver alloy can preferably be prepared from the Ag—Au—Bi alloy containing at least 1 at. % and not more than 30 at. % of Au and at least 0.01 at. % and not more than 3 at. % of Bi in which Bi is at least partially (partially or entirely) deposited as oxide particles. The silver alloy which is mainly composed of the solid solution has high mechanical strength. Higher strength can be attained by making Bi deposit as oxide particles. In this silver alloy, the Bi concentration is set in the range of 0.01 to 3 at. %. If the Bi concentration is less than 0.01 at. %, characteristics such as high mechanical strength and specific resistance cannot be improved at desire. If the Bi concentration is in excess of 3 at. %, on the other hand, reaction between Bi and the superconductor is so remarkable in the wire preparation process that no wire having excellent critical temperature and critical current density can be obtained. This silver alloy can bring further increase in the electric resistance, due to the addition of Au. If the amount of Au is less than 1 at. %, however, it is difficult to bring further remarkable increase in the electric resistance. In consideration of the cost and the attainable effect, on the other hand, the Au concentration is preferably up to 30 at. %. Bi may be previously oxidized, or can alternatively be oxidized during the steps of preparing the wire. In order to further improve the specific resistance, on the other hand, the solid solution state is preferably sufficiently maintained.

Throughout the specification, the term "at. %" indicating concentration expresses the atomic percentage, i.e., the rate (percentage) of specific atoms to the number of all atoms contained in a composition or a mixture.

In the oxide superconducting wire according to the present invention, on the other hand, the stabilizing metal can comprise a first portion which directly covers the filament(s), and a second portion which covers the first portion. In this structure, the first portion is made of a material which prevents the component of the second portion from diffusing into and reacting with the oxide superconductor. In such a structure, the first portion consists essentially of a material which is poor in reactivity with the oxide superconductor, not to substantially react with the oxide superconductor. Such a first portion is preferably made of a material which consists essentially of any of the aforementioned alloys (A) to (H), or is selected from the group consisting of Ag, an Ag—Zr alloy, an Ag—Sb alloy, an Ag—Ti alloy and an Ag—Au alloy. The first and second portions which form a composite matrix with each other can be made of different materials. Due to the protective effect by the first portion, the second portion may be prepared from a material containing a considerable amount of an element having reactivity with the oxide superconductor. Due to such a structure, therefore, the range of materials which can be employed for the stabilizing metal matrix is so widened that a further effective material can be employed for further improving the mechanical strength and/or the specific resistance of the wire. The second portion can be made of at least one material selected from the group consisting of the aforementioned alloys (A) to (H), an Ag—Mg alloy, an Ag—Ni alloy, an Ag—Mg—Ni alloy and an Ag—Zr alloy. In particular, the mechanical strength and/or the specific resistance of the wire can be further improved by applying the Ag—Mg alloy, the Ag—Ni alloy or the Ag—Mg—Ni alloy, which is unsuitable for the first portion due to the high reactivity with the oxide superconductor, to the second portion. Additionally, the second portion can be composed of an Ag—Mn alloy containing Mn in the range of 1 at. % to 5 at. % in which a part of Mn is deposited in the solid solution as oxide particles. Thus, the second portion can be composed of an Ag—Mn alloy containing Mn in the range of 0.01 at. % to 5 at. % in which a part of Mn is deposited in the solid solution as oxide particles.

In the stabilizing metal comprising the first portion directly covering the filaments and the second portion covering the first portion, the first portion may consist essentially of a silver alloy having higher specific resistance than silver for reducing ac loss which is caused across the plurality of filaments. In this case, the first portion is preferably made of a material having poor reactivity with the oxide superconductor and high specific resistance. In consideration of this point, the first portion is preferably made of at least any of the aforementioned alloys (A) to (H). Alternatively, the first portion can be made of an Ag—Zr alloy, an Ag—Ti alloy or an Ag—Au alloy. On the other hand, the second portion can be made of a material which is selected from the group consisting of the aforementioned alloys (A) to (H), an Ag—Mg alloy, an Ag—Ni alloy, an Ag—Mg—Ni alloy and an Ag—Zr alloy. Due to the composite structure of the stabilizing metal, the first and second portions can be made of different materials. Additionally, the second portion can be composed of an Ag—Mn alloy containing Mn in the range of 1 at. % to 5 at. % in which a part of Mn is deposited in the solid solution as oxide particles. Thus, the second portion can be composed of an Ag—Mn alloy containing Mn in the range of 0.01 at. % to 5 at. % in which a part of Mn is deposited in the solid solution as oxide particles.

Silver alloys containing 0.01 at. % to 5 at. % of Zr, for example, 0.01 at. % to 5 at. % of Ti, for example, and 1 at. % to 30 at. % of Au, for example, can be employed as the aforementioned Ag—Zr, Ag—Ti and Ag—Au alloys respectively. Further, silver alloys containing 0.01 at. % to 20 at. % of Mg, for example, 0.01 at. % to 0.5 at. % of Ni, for example, and 0.01 at. % to 5 at. % of Mg and Ni respectively, for example, can be employed for the Ag—Mg, Ag—Ni and Ag—Mg—Ni alloys respectively.

According to the present invention, the overall matrix covering the filament(s) of the oxide superconductor can be made of the silver alloy, while this matrix can alternatively be partially made of the silver alloy, with a rest of silver. The arrangement of the silver alloy can be decided in consideration of the mechanical strength of the wire, the influence exerted by the silver alloy on the oxide superconductor, the ac loss of the wire, and the like. For example, the portion directly covering the oxide superconductor filament(s) can be made of silver with arrangement of the silver alloy around the same, in order to prevent the silver alloy component from diffusing into and reacting with the oxide superconductor. Namely, the stabilizing metal can consist essentially of a portion, consisting essentially of silver, directly covering the filament(s), and a portion, consisting essentially of the silver alloy, covering the same. According to the present invention, the stabilizing metal can alternatively consist essentially of a portion, consisting essentially of silver, directly covering the filament(s), a portion, consisting essentially of the silver alloy, covering the same, and a portion, consisting essentially of silver or the silver alloy, further covering the same. In consideration of reduction in ac loss, on the other hand, the filament(s) can directly be covered with the silver alloy. In this case, the stabilizing metal can consist essentially of a portion, consisting essentially of the silver alloy, directly covering the filament(s), and a portion, consisting essentially of silver, covering the same. Thus, silver and a silver alloy can be composited with each other for forming a matrix of the stabilizing metal.

Figure 1A:
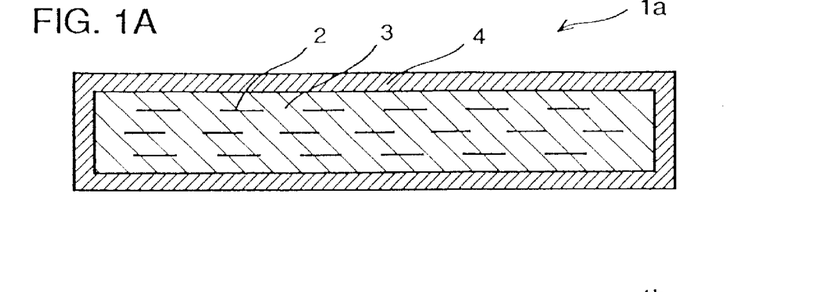
FIGS. 1A, 1B and 1C are sectional views typically illustrating wires according to embodiments of the present invention.
Figure 1B:
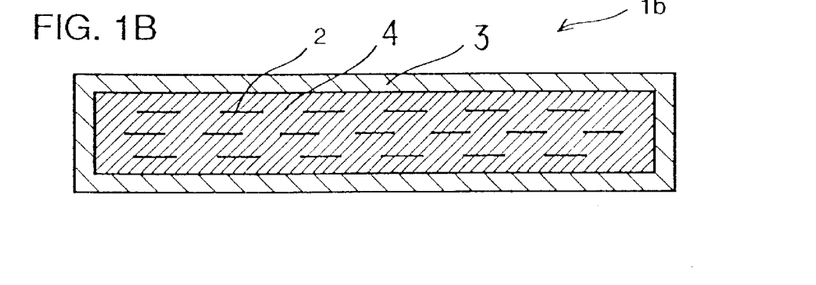
Figure 1C:
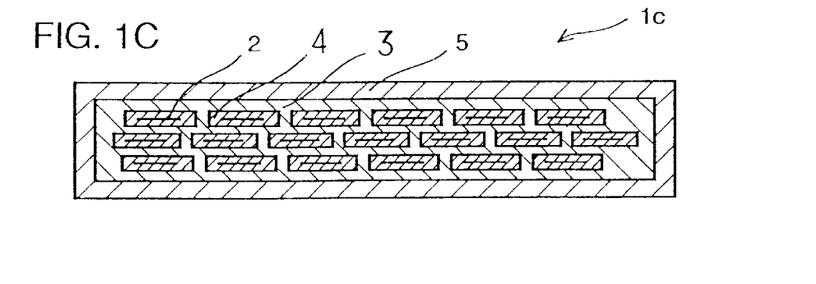

The aforementioned composition of the stabilizing metal can be readily attained in the multifilamentary superconducting wire. In preparation of the multifilamentary wire, raw material powder for an oxide superconductor is charged in a first metal sheath, to obtain a strand after plastic working. A plurality of the obtained strands are bundled and charged in a second metal sheath, to prepare a multifilamentary wire through plastic working and a heat treatment. At this time, materials forming the first and second sheaths are so selected as to composite silver and the silver alloy or different types of the silver alloys with each other. FIG. 1A shows an embodiment employing the silver alloy and silver for the first and second sheaths respectively. In a tape wire 1a, filaments 2 are directly covered with the silver alloy 3 consisting essentially of the Ag—Sb or Ag—Au—Sb alloy, for example, while the silver alloy 3 is covered with silver 4. FIG. 1B shows an embodiment employing silver and the silver alloy for the first and second sheaths respectively. In a tape wire 1b, filaments 2 are directly covered with silver 4, which in turn is coated with the silver alloy 3 such as an Ag—Sb or Ag—Au—Sb alloy, for example. FIG. 1C shows an embodiment employing the first sheaths having inner sides of silver and outer sides of a silver alloy, and the second sheath of silver or the silver alloy. In a tape wire 1c, filaments 2 are directly covered with silver 4, which in turn is covered with the silver alloy 3 such as an Ag—Sb or Ag—Au—Sb alloy, for example. The silver alloy 3 is coated with a stabilizing matrix 5 consisting essentially of silver or the aforementioned silver alloy. In the aforementioned structure, the first and second metal sheaths may be prepared from silver alloys respectively.

In a method of preparing the multifilamentary superconducting wire according to the present invention, the first stabilizing metal sheath to be charged with raw material powder can be made of the silver alloy which is selected from the group consisting essentially of the aforementioned alloys (a) to (h), an Ag—Zr alloy, an Ag—Ti alloy and an Ag—Au alloy. On the other hand, the second stabilizing metal sheath for engaging strands can be made of the silver alloy which is selected from the group consisting of the aforementioned alloys (a) to (h), an Ag—Mg alloy, an Ag—Ni alloy, an Ag—Mg—Ni alloy and an Ag—Zr alloy. As hereinabove described, the heat treatment is preferably performed under an atmosphere containing oxygen at a partial pressure of at least 0.01 atm. at a temperature of not more than 850° C. when either stabilizing metal sheath is prepared from the silver alloy containing Mn. When either stabilizing metal sheath is prepared from the silver alloy containing a metal selected from the group consisting of Sb, Pb and Bi, on the other hand, the heat treatment is preferably carried out under an atmosphere containing oxygen at a partial pressure of not more than 0.08 atm. at a temperature of not more than 850° C. When the Ag—Zr alloy, Ag—Ti alloy, Ag—Mg alloy, Ag—Ni alloy or Ag—Mg—Ni alloy is employed, the heat treatment is preferably carried out under an atmosphere containing oxygen at a partial pressure of not more than 0.08 atm. at a temperature of not more than 850° C., for example. When an Ag—Au alloy is employed, on the other hand, the oxygen partial pressure in the heat treatment atmosphere is not particularly restricted.

In the process of preparing a multifilamentary wire, on the other hand, the first and second stabilizing metal sheaths can be made of the silver alloy and silver respectively. Alternatively, the first and second stabilizing metal sheaths can be made of silver and the silver alloy respectively. On the other hand, the first and second stabilizing metal sheath can consist essentially of a composite material employing silver for a portion which is directly in contact with the raw material powder and the silver alloy for the remaining portion, while the second stabilizing metal sheath can consist essentially of the silver alloy or silver.

In the aforementioned process of preparing a multifilamentary wire, either stabilizing metal sheath can preferably be prepared from the silver alloy in which a metal selected from the group consisting of Mn, Sb, Pb and Bi is at least partially oxidized previously by internal oxidation.

In the method according to the present invention, the heat treatment is carried out under an atmosphere containing a proper amount of oxygen in response to the type of the silver alloy employed for the stabilizing metal sheath, thereby causing oxidation, particularly internal oxidation, of the stabilizing metal sheath consisting essentially of the silver alloy and increasing mechanical strength thereof. When the silver alloy containing Mn is employed, the oxygen partial pressure in the heat treatment atmosphere is preferably at least 0.01 atm. If the oxygen partial pressure is less than 0.01 atm., oxidation of Mn so insufficiently progresses that it is difficult to attain sufficient improvement of the strength. If the oxygen partial pressure is less than 0.01 atm., further, Mn so readily react with the oxide superconductor that the obtained wire is deteriorated in the superconducting property such as the critical current density. When the silver alloy containing Mn is employed, a wire of preferable characteristics can be obtained by the heat treatment also under the atmosphere containing oxygen in relatively high concentration such as the atmosphere (oxygen partial pressure: about 0.2 atm.), for example. When the silver alloy containing a metal selected from the group consisting of Sb, Pb and Bi is employed, on the other hand, the oxygen partial pressure in the heat treatment atmosphere is preferably not more than 0.08 atm., in order to partially maintain the metal as a solid solution with no oxidation, thereby attaining an effect of improving the specific resistance. The metal is easier to be oxidized as compared with Mn, while the specific resistance can be further improved by partially leaving the metal with no oxidation. When the silver alloy containing the metal selected from the group consisting of Si, Pb and Bi is employed, therefore, the oxygen partial pressure is preferably not more than 0.08 atm. The heat treatment temperature is not more than 850° C., preferably 840 to 850° C. If a temperature exceeding 850° C. is employed for the heat treatment, the critical current density of the obtained wire is remarkably reduced.

When the alloy selected from the group consisting of the Ag—Mn alloy,. Ag—Au—Mn alloy, Ag—Sb alloy, Ag—Au—Sb alloy, Ag—Pb alloy, Ag—Au—Pb alloy, Ag—Bi alloy and Ag—Au—Bi alloy each containing a metal selected from the group consisting of Mn, Sb, Pb and Bi in concentration values in the prescribed range is employed for the sheath material, the strength of the sheath is improved. When a pressure is applied to the raw material powder for the superconductor in the sheath which is thus improved in strength, the powder is readily pressurized and the charging density thereof is increased. A wire which exhibits a high critical current density is obtained by high densification of the powder.

When the heat treatment is carried out under the atmosphere containing oxygen, the strength of the sheath is improved and a wire having high mechanical strength is obtained.

In the wire which is improved in strength, such as the yield point in the tensile strength, for example, in accordance with the present invention, the superconducting property is less deteriorated against bending distortion and stress in handling. Such a wire can be accurately arranged in a conductor or a coil with high tension in preparation thereof, thereby bringing a conductor or a coil having small wire movement. While hoop stress which is caused by electromagnetic force acts on the wire as tensile force upon coiling, the critical current density is not deteriorated up to high stress in the inventive wire having a high yield point with no specific reinforcement. According to the present invention, no reinforcement with a stainless tape etc. is required and hence a high coil current density can also be attained. Further, yield strength of the wire is increased at a low temperature as compared with that at the room temperature. Under a low temperature of 77 K, 20 K or 4.2 K for employing the coil, therefore, the critical current density is not deteriorated up to stress which is higher than the yield point at the room temperature.

The strength of the sheath can be improved by oxidizing its interior including the aforementioned silver alloy before charging the same with the raw material powder. When such a sheath is employed, the density of a superconducting part is so readily improved in plastic working that the finally obtained wire has a high critical current density. Further, the concentration of the metal selected from the group consisting of Mn, Sb, Pb and Bi which are reactive with the superconducting part is further reduced, whereby reaction between the superconducting part and the alloy component is further suppressed in the sintering process.

Further, electric resistance of the sheath is improved due to the employment of the aforementioned silver alloy, whereby ac loss which is caused in the wire is reduced. When the electric resistance is increased, heat conductivity is reduced under the Wiededmann-Franz's law. When the present invention is applied to a current lead, therefore, the amount of heat penetration is reduced.

On the other hand, a wire which is superior in mechanical strength, specific resistance and superconducting property can be obtained by providing the first stabilizing metal directly covering the filament(s) with a diffusion preventing function and/or an ac loss reducing function and by covering the same with an arbitrary second stabilizing metal. When the first stabilizing metal is provided with the diffusion preventing function, the range of materials selected for the second stabilizing metal is so widened that a material having a higher effect can be employed for improving the mechanical strength and the specific resistance of the wire. Further, ac loss of the wire is effectively reduced by preparing the first stabilizing metal from the silver alloy having high specific resistance.

In addition, a wire having high stability and reduced ac loss can be obtained by compositing silver and the silver alloy, as described above. These materials are composited with each other in the aforementioned manner, for example, so that deterioration of superconductivity caused by reaction with the alloy component is prevented by employing silver for the portion which is directly in contact with the filament(s) while arranging the silver alloy around the same. When the silver alloy is arranged around the filament(s), on the other hand, ac loss of the wire, particularly coupling loss, is effectively reduced. When the sheath to be charged with the powder is prepared from that having inner and outer sides which are made of silver and the silver alloy respectively in the multifilamentary wire, deterioration of superconductivity can be prevented and coupling loss can be reduced.

The present invention is particularly applied to the wire employing a bismuth based oxide superconductor such as Bi—Pb—Sr—Ca—Cu—O system. In particular, the present invention is applied to a wire employing a bismuth based 2223 oxide superconducting phase such as (Bi, Pb)$_2$Sr$_2$Ca$_2$CU$_3$O$_{10-x}$ (0≦X<1) as the filament(s).

EXAMPLE 1

Figure 2:
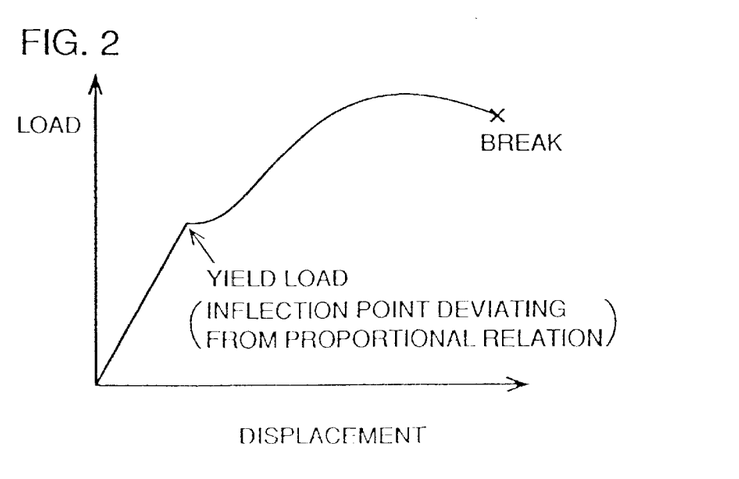
FIG. 2 is a load-displacement chart for obtaining the yield point in the tensile test.

Bi$_2$O$_3$, PbO, SrCO$_3$, CaCO$_3$ and CuO were blended with each other to obtain powder containing Bi, Pb, Sr, Ca and Cu in composition ratios of 1.8:0.4:2:2:3. This powder was heat treated at 700° C. for 12 hours and at 800° C. for 8 hours respectively, and further heat treated at 850° C. for 8 hours. The blend was pulverized by a ball mill after each heat treatment. The powder obtained by the pulverization was heat treated at 800° C. for 15 minutes for deaeration, and thereafter charged into silver alloy pipes of 12 mmϕ in outer diameter and 10 mmϕ in inner diameter. Table 1 shows the compositions of the employed silver alloy pipes. For the purpose of comparison, a silver pipe was also employed. The pipes charged with the powder were drawn into 1.02 mmϕ, and the obtained wires were cut so that 61 wires were engaged in a pipe of 12 mmϕ in outer diameter and 9 mmϕ in inner diameter having the same composition as the first pipe every sample. These pipes were drawn into 1.15 mmϕ, and thereafter rolled into 0.24 mm in thickness. The rolled wires were primarily heat treated at temperatures shown in Table 1 for 50 hours respectively, and thereafter rolled into 0.2 mm in thickness. Then, the wires were secondarily heat treated at temperatures shown in Table 1 for 50 hours respectively. Both of the primary and secondary heat treatments were carried out in the atmosphere. As to the obtained wires, critical temperatures (Tc), specific resistance values at temperatures immediately above the critical temperatures (critical temperatures+1 K), and critical current densities (Jc) in liquid nitrogen with no application of external magnetic fields were measured by a dc four-probe method. Further, a tensile test was made at the room temperature, to obtain yield points. In order to measure the yield points of the wires, portions of 150 mm in length were sampled and subjected to the tensile test at the room temperature by an Instron type testing machine at a chuck-to-chuck distance of 100 mm and an elastic stress rate of 20 mm/h. The yield points were obtained by deciding yield loads from a load-displacement chart shown in FIG. 2 and dividing the same by sectional areas before the tensile test. Table 1 shows the results.

TABLE 1

|  | No. | Alloy Type (at %) | | Primary Heat Treatment (° C.) | Secondary Heat Treatment (° C.) | Tc (K) | Specific Resistance (μΩ.cm) | Jc (A/cm$^2$) | Yield Point (kg/mm$^2$) |
|---|---|---|---|---|---|---|---|---|---|
|  |  | Mn | Au |  |  |  |  |  |  |
| Example | 1 | 0.30 | 0 | 845 | 840 | 104 | 0.82 | 23000 | 13.6 |
|  | 2 | 0.01 | 0 | 849 | 840 | 110 | 0.6 | 24000 | 10.0 |
|  | 3 | 0.99 | 0 | 840 | 845 | 103 | 2.0 | 20000 | 20.0 |
|  | 4 | 0.50 | 0 | 845 | 840 | 104 | 1.5 | 20000 | 18.0 |
|  | 5 | 0.01 | 1.0 | 845 | 840 | 110 | 0.8 | 25000 | 10.0 |
|  | 6 | 0.50 | 10.0 | 840 | 840 | 107 | 5.0 | 20000 | 19.0 |
|  | 7 | 0.99 | 30.0 | 840 | 845 | 105 | 11.0 | 20000 | 22.0 |
|  | 8 | 0.30 | 20.0 | 845 | 840 | 107 | 8.0 | 23000 | 16.5 |
| Comparative Example | 1 | 0.005 | 0 | 845 | 840 | 110 | 0.35 | 25000 | 4.1 |
|  | 2 | 1.5 | 0 | 845 | 840 | 90 | 1.0 | 1000 | 20.0 |
|  | 3 | 0.005 | 0.9 | 845 | 840 | 110 | 0.55 | 23000 | 4.5 |
|  | 4 | 0.5 | 10.0 | 855 | 855 | 95 | 1.5 | 2500 | 19.0 |
|  | 5 | 0 | 0 | 845 | 840 | 110 | 0.23 | 18000 | 4.0 |

EXAMPLE 2

A silver alloy pipe having the composition of the sample No. 1 in Example 1 was employed to prepare a wire similarly to Example 1, except that primary and secondary heat treatments were carried out in a vacuum of 20 Torr (oxygen partial pressure: 0.005 atm.) at 835° C. and 840° C. respectively. The obtained wire exhibited a critical temperature of 100 K and a critical current density of 10,000 A/cm$^2$. The wire obtained in this manner was inferior in superconducting property to Example 1. Further, this wire exhibited small yield strength of 6 kg/mm at the room temperature.

EXAMPLE 3

An Ag—0.5 at. % Mn—10 at. % Au alloy pipe which was previously heat treated in the atmosphere at 850° C. for 70 hours was employed to prepare a wire similarly to the sample No. 6 in Example 1. The obtained wire exhibited the same critical temperature and yield point as the sample No. 6 in Example 1. On the other hand, the superconducting part provided in the sheath of this Example was at a high density of 6.35 g/cm$^3$ while that of the sample No. 6 in Example 1 was 6.1 g/cm$^3$, and a high critical current density of 26,000 A/cm$^2$ was attained.

EXAMPLE 4

Bi$_2$O$_3$, PbO, SrCO$_3$, CaCO$_3$ and CuO were blended with each other to obtain powder containing Bi, Pb, Sr, Ca and Cu in composition ratios of 1.8:0.4:2:2:3. This powder was successively heat treated at 700° C. for 12 hours, at 800° C. for 8 hours, and at 850° C. for 8 hours. The blend was pulverized by a ball mill after each heat treatment. The powder obtained by the pulverization was heat treated at 800° C. for 15 minutes for deaeration, and thereafter charged in silver alloy pipes of 12 mmφ in outer diameter and 10 mmφ in inner diameter. Table 2 shows the compositions of the employed silver alloy pipes. For the purpose of comparison, an experiment employing a silver pipe was also performed. The pipes charged with the powder were drawn into 1.02 mmφ, and the obtained wires were cut so that 61 wires were engaged in a pipe of 12 mmφ in outer diameter and 9 mmφ in inner diameter having the same composition as the first pipe every sample. These pipes were drawn into 1.15 mmφ, and thereafter rolled into 0.24 mm in thickness. The rolled wires were primarily heat treated at temperatures shown in Table 2 for 50 hours respectively, and thereafter rolled into 0.2 mm in thickness. Then, the wires were secondarily heat treated at temperatures shown in Table 2 for 50 hours respectively. Both of the primary and secondary heat treatments were carried out in the atmosphere. As to the obtained wires, critical temperatures (Tc), specific resistance values at temperatures immediately above the critical temperatures (critical temperatures+1 K), and critical current densities (Jc) in liquid nitrogen with no application of external magnetic fields were measured by a dc four-probe method. Further, a tensile test was made at the room temperature in the aforementioned manner, to obtain yield points. Table 2 shows the results.

same critical temperature and yield point as the sample No. 6 in Example 4. The superconducting part provided in the sheath of this Example was at a high density of 6.35 g/cm$^3$ while that of the sample No. 6 in Example 4 was 6.1 g/cm$^3$, and a high critical current density of 42,000 A/cm$^2$ was attained.

EXAMPLE 7

$Bi_2O_3$, PbO, $SrCO_3$, $CaCO_3$ and CuO were blended with each other to obtain powder containing Bi, Pb, Sr, Ca and Cu in composition ratios of 1.8:0.4:2:2:3. This powder was successively heat treated at 700° C. for 12 hours, at 800° C. for 8 hours, and at 850° C. for 8 hours. The blend was pulverized by a ball mill after each heat treatment. The powder obtained by the pulverization was heat treated at 800° C. for 15 minutes for degassing, and thereafter charged into silver alloy pipes of 12 mmφ in outer diameter and 10 mmφ in inner diameter. Table 3 shows the compositions of the employed silver alloy pipes. For the purpose of comparison, an experiment employing a silver pipe was also performed. The pipes charged with the powder were drawn into 1.02 mmφ, and thereafter the obtained wires were cut so that 61 wires were engaged in a pipe of 12 mmφ in outer diameter and 9 mmφ in inner diameter having the same composition as the first pipe every sample. These pipes were drawn into 1.15 mmφ, and thereafter rolled into 0.24 mm in

TABLE 2

|  |  | Alloy Type (at %) |  | Primary Heat Treatment | Secondary Heat Treatment | Tc | Specific Resistance | Jc | Yield Point |
|---|---|---|---|---|---|---|---|---|---|
|  | No. | Sb | Au | (° C.) | (° C.) | (K) | (μΩ.cm) | (A/cm$^2$) | (kg/mm$^2$) |
| Example | 1 | 0.30 | 0 | 845 | 840 | 107 | 0.3 | 32000 | 6.5 |
|  | 2 | 0.01 | 0 | 849 | 840 | 110 | 0.3 | 35000 | 5.0 |
|  | 3 | 3.99 | 0 | 840 | 845 | 105 | 2.00 | 22000 | 11.5 |
|  | 4 | 0.50 | 0 | 845 | 840 | 107 | 0.4 | 32000 | 8.0 |
|  | 5 | 1.01 | 1.0 | 845 | 840 | 110 | 0.78 | 27000 | 11.0 |
|  | 6 | 0.50 | 10.0 | 840 | 840 | 107 | 5.00 | 30000 | 8.0 |
|  | 7 | 5.00 | 30.0 | 840 | 845 | 105 | 10.00 | 27000 | 12.0 |
|  | 8 | 2.30 | 20.0 | 845 | 840 | 107 | 7.8 | 25000 | 11.5 |
| Comparative | 1 | 0.005 | 0 | 845 | 840 | 110 | 0.35 | 25000 | 4.1 |
| Example | 2 | 5.5 | 0 | 845 | 840 | 90 | 1.00 | 1000 | 20.0 |
|  | 3 | 0.005 | 0.9 | 845 | 840 | 110 | 0.55 | 23000 | 4.5 |
|  | 4 | 5.5 | 10.0 | 855 | 855 | 95 | 1.50 | 2500 | 19.0 |
|  | 5 | 0 | 0 | 845 | 840 | 110 | 0.23 | 18000 | 4.0 |

EXAMPLE 5

The pipe of the sample No. 1 in Example 4 was employed to prepare a wire similarly to Example 4, except that primary and secondary heat treatments were carried out in a vacuum of 20 Torr (oxygen partial pressure: 0.05 atm.) at 835° C. and 840° C. respectively. The obtained wire exhibited a critical temperature of 106 K and a critical current density of 20,000 A/cm$^2$, while specific resistance at a temperature immediately above the critical temperature was at a high value of 1.5 μΩ·cm.

EXAMPLE 6

An Ag—0.5 at. % Sb—10 at. % Au alloy pipe which was previously heat treated in the atmosphere at 850° C. for 70 hours was employed to prepare a wire similarly to the sample No. 6 in Example 4. The obtained wire exhibited the thickness. The rolled wires were primarily heat treated at temperatures shown in Table 3 for 50 hours respectively, and thereafter rolled into 0.2 mm in thickness. Then, the wires were secondarily heat treated at temperatures shown in Table 3 for 50 hours respectively. Both of the primary and secondary heat treatments were carried out in the atmosphere. As to the obtained wires, critical temperatures (Tc), specific resistance values at temperatures immediately above the critical temperatures (critical temperatures+1 K), and critical current densities (Jc) in liquid nitrogen with no application of external magnetic fields were measured by a dc four-probe method. Further, a tensile test was made at the room temperature in the aforementioned manner, to obtain yield points. Table 3 shows the results.

TABLE 3

| | No. | Alloy Type (at %) Pb | Alloy Type (at %) Au | Primary Heat Treatment (° C.) | Secondary Heat Treatment (° C.) | Tc (K) | Specific Resistance (μΩ.cm) | Jc (A/cm²) | Yield Point (kg/mm²) |
|---|---|---|---|---|---|---|---|---|---|
| Example | 1 | 3.00 | 1.0 | 845 | 840 | 110 | 2.00 | 25000 | 18.2 |
| | 2 | 1.00 | 10.0 | 840 | 840 | 107 | 5.00 | 20000 | 10.03 |
| | 3 | 0.10 | 30.0 | 840 | 845 | 105 | 10.00 | 20000 | 7.1 |
| | 4 | 0.50 | 20.0 | 845 | 840 | 107 | 8.00 | 23000 | 8.9 |
| | 5 | 0.01 | 0.00 | 847 | 842 | 104 | 0.80 | 20000 | 5.0 |
| | 6 | 0.50 | 10.0 | 845 | 840 | 106 | 4.5 | 21000 | 7.2 |
| | 7 | 3.00 | 0.00 | 842 | 837 | 106 | 1.30 | 22000 | 9.4 |
| | 8 | 5.00 | 0.00 | 840 | 838 | 107 | 1.50 | 20500 | 10.8 |
| Comparative Example | 1 | 0.005 | 0 | 845 | 840 | 110 | 0.50 | 25000 | 6.1 |
| | 2 | 5.5 | 0 | 845 | 840 | 90 | 1.00 | 1000 | 9.3 |
| | 3 | 0.003 | 0.9 | 845 | 840 | 110 | 0.50 | 23000 | 5.2 |
| | 4 | 5.6 | 10.0 | 855 | 855 | 95 | 1.50 | 2500 | 11.6 |
| | 5 | 0 | 0 | 845 | 840 | 110 | 0.50 | 18000 | 4.0 |

EXAMPLE 8

The pipe of the sample No. 1 in Example 7 was employed to prepare a wire similarly to Example 7, except that primary and secondary heat treatments were carried out in a vacuum of 20 Torr (oxygen partial pressure: 0.01 atm.) at 835° C. and 840° C. respectively. The obtained wire exhibited a critical temperature of 105 K and a critical current density of 20,000 A/cm, while specific resistance at a temperature immediately above the critical temperature was at a high value of 1.8 μΩ·cm.

EXAMPLE 9

An Ag—0.5 at. % Pb—10 at. % Au alloy pipe which was previously heat treated in the atmosphere at 850° C. for 70 hours was employed to prepare a wire similarly to the sample No. 6 in Example 7. The obtained wire exhibited the same critical temperature and yield point as the sample No. 6 in Example 7. The superconducting part provided in the sheath of this Example was at a high density of 6.35 g/cm³ while that of the sample No. 6 in Example 7 was 6.1 g/cm³, and a high critical current density of 26,000 A/cm² was attained.

EXAMPLE 10

Bi₂O₃, PbO, SrCO₃, CaCO₃ and CuO were blended with each other to obtain powder containing Bi, Pb, Sr, Ca and Cu in composition ratios of 1.8:0.4:2:2:3. This powder was successively heat treated at 700° C. for 12 hours, at 800° C. for 8 hours, and at 850° C. for 8 hours. The blend was pulverized by a ball mill after each heat treatment. The powder obtained by the pulverization was heat treated at 800° C. for 15 minutes for deaeration, and thereafter charged in silver alloy pipes of 12 mmφ in outer diameter and 10 mmφ in inner diameter. Table 4 shows the compositions of the employed silver alloy pipes. For the purpose of comparison, an experiment employing a silver pipe was also performed. The pipes charged with the powder were drawn into 1.02 mmφ, and thereafter the obtained wires were cut so that 61 wires were engaged in a pipe of 12 mmφ in outer diameter and 9 mmφ in inner diameter having the same composition as the first pipe every sample. These pipes were drawn into 1.15 mmφ, and thereafter rolled into 0.24 mm in thickness. The rolled wires were primarily heat treated at temperatures shown in Table 4 for 50 hours respectively, and thereafter rolled into 0.2 mm in thickness. Then, the wires were secondarily heat treated at temperatures shown in Table 4 for 50 hours respectively. Both of the primary and secondary heat treatments were carried out in the atmosphere. As to the obtained wires, critical temperatures (Tc), specific resistance values at temperatures immediately above the critical temperatures (critical temperatures+1 K), and critical current densities (Jc) in liquid nitrogen with no application of external magnetic fields were measured by a dc four-probe method. Further, a tensile test was made at the room temperature in the aforementioned manner, to obtain yield points. Table 4 shows the results.

TABLE 4

| | No. | Alloy Type (at %) Bi | Alloy Type (at %) Au | Primary Heat Treatment (° C.) | Secondary Heat Treatment (° C.) | Tc (K) | Specific Resistance (μΩ.cm) | Jc (A/cm²) | Yield Point (kg/mm²) |
|---|---|---|---|---|---|---|---|---|---|
| Example | 1 | 0.01 | 0 | 845 | 840 | 107 | 0.80 | 23000 | 6.0 |
| | 2 | 0.05 | 0 | 849 | 840 | 110 | 1.50 | 24000 | 7.2 |
| | 3 | 3.99 | 0 | 842 | 840 | 105 | 2.00 | 20000 | 12.0 |
| | 4 | 5.00 | 0 | 845 | 840 | 107 | 2.50 | 20000 | 15.0 |
| | 5 | 0.3 | 30 | 845 | 840 | 108 | 9.00 | 21000 | 10.3 |
| | 6 | 1.0 | 20 | 843 | 838 | 106 | 7.4 | 23000 | 14.4 |
| | 7 | 3.0 | 5 | 843 | 840 | 105 | 8.3 | 20000 | 17.8 |
| | 8 | 5.0 | 1 | 842 | 838 | 105 | 4.6 | 21000 | 19.3 |

TABLE 4-continued

|  | No. | Alloy Type (at %) | | Primary Heat Treatment (° C.) | Secondary Heat Treatment (° C.) | Tc (K) | Specific Resistance ($\mu\Omega$·cm) | Jc (A/cm$^2$) | Yield Point (kg/mm$^2$) |
|---|---|---|---|---|---|---|---|---|---|
|  |  | Bi | Au |  |  |  |  |  |  |
| Comparative Example | 1 | 0.005 | 0 | 845 | 840 | 106 | 0.7 | 22000 | 4.7 |
|  | 2 | 8.0 | 0 | 845 | 840 | 105 | 5.0 | 8000 | 19.0 |
|  | 3 | 0 | 5 | 846 | 840 | 105 | 6.8 | 21000 | 4.0 |
|  | 4 | 10 | 1 | 843 | 838 | 104 | 7.3 | 6000 | 20.3 |
|  | 5 | 0 | 0 | 845 | 840 | 106 | 0.23 | 22000 | 4.0 |

EXAMPLE 11

The pipe of the sample No. 1 in Example 10 was employed to prepare a wire similarly to Example 10, except that primary and secondary heat treatments were carried out in a vacuum of 20 Torr (oxygen partial pressure: 0.01 atm.) at 835° C. and 840° C. respectively. The obtained wire exhibited a critical temperature of 108 K and a critical current density of 20,000 A/cm$^2$, while specific resistance at a temperature immediately above the critical temperature was at a high value of 0.8 $\mu\Omega$·cm.

EXAMPLE 12

Metal sheaths for charging powder and those for engaging strands were made of different materials respectively, to prepare wires similarly to Example 4. Table 5 shows combinations of the sheaths. As to the compositions of the sheaths, Table 5 shows only atomic percentages of the added elements, with the rests of silver. Primary and secondary heat treatments were carried out at 845° C. and 840° C. respectively. As to the obtained wires, critical temperatures (Tc) and critical current densities (Jc) in liquid nitrogen with no application of external magnetic fields were measured by a dc four-probe method. Further, specific resistance values at temperatures immediately above the critical temperatures were measured, while a tensile test was made at the room temperature in the aforementioned manner, to obtain yield points. Table 5 shows the results.

TABLE 5

|  | No. | For Charging | | For Engagement | | Tc (K) | Jc (A/cm$^2$) | Specific Resistance ($\mu\Omega$·cm) | Yield Point (kg/mm$^2$) |
|---|---|---|---|---|---|---|---|---|---|
|  |  | Sb | Au | Sb | Au |  |  |  |  |
| Example | 1 | 0.01 | 0 | 0 | 0 | 109 | 30000 | 0.3 | 13.6 |
|  | 2 | 3 | 0 | 0 | 0 | 108 | 25000 | 2.2 | 20.1 |
|  | 3 | 5 | 0 | 0 | 0 | 106 | 23000 | 2.5 | 10.5 |
|  | 4 | 0.1 | 5 | 0 | 0 | 110 | 30000 | 1.7 | 14.6 |
|  | 5 | 0 | 0 | 0.01 | 0 | 110 | 35000 | 0.3 | 15.9 |
|  | 6 | 0 | 0 | 5 | 0 | 109 | 32000 | 1.3 | 20.4 |
|  | 7 | 0 | 0 | 2 | 3 | 110 | 32000 | 1.4 | 17.3 |
|  | 8 | 0 | 0 | 5 | 20 | 110 | 29000 | 3.0 | 22.3 |
| Comparative Example | 1 | 0 | 0 | 0 | 0 | 110 | 22000 | 0.23 | 4.0 |

EXAMPLE 13

A sheath for charging powder was formed by a silver alloy sheath having inner and outer sides of Ag and an Ag—3 at. % Sb alloy respectively while a metal sheath for engagement was formed by an Ag sheath, to prepare a wire similarly to Example 12. The obtained wire exhibited a high critical temperature of 110 K, a high critical current density of 20,000 A/cm$^2$ and a high yield point of 13.0 kg/mm$^2$. Ac loss was 1.5×10$^{-4}$ W/m in energization at 10 A, and this value was lower than that (2.9×10$^{-3}$ W/m) in the case of employing a pure silver sheath.

EXAMPLE 14

Metal sheaths for charging powder and those for engaging strands were made of different materials respectively, to prepare wires similarly to Example 7. Table 6 shows combinations of the sheaths. As to the compositions of the sheaths, Table 6 shows only atomic percentages of the added elements, with the rests of silver. Primary and secondary heat treatments were carried out at 845° C. and 840° C. respectively. As to the obtained wires, critical temperatures (Tc) and critical current densities (Jc) in liquid nitrogen with no application of external magnetic fields were measured by a dc four-probe method. Further, specific resistance values at temperatures immediately above the critical temperatures were measured, while a tensile test was made at the room temperature in the aforementioned manner, to obtain yield points. Table 6 shows the results.

was $1.5 \times 10^{-4}$ W/m in energization at 10 A, and this value was lower than that ($2.9 \times 10^{-3}$ W/m) in the case of employing a pure silver sheath.

Figure 3:
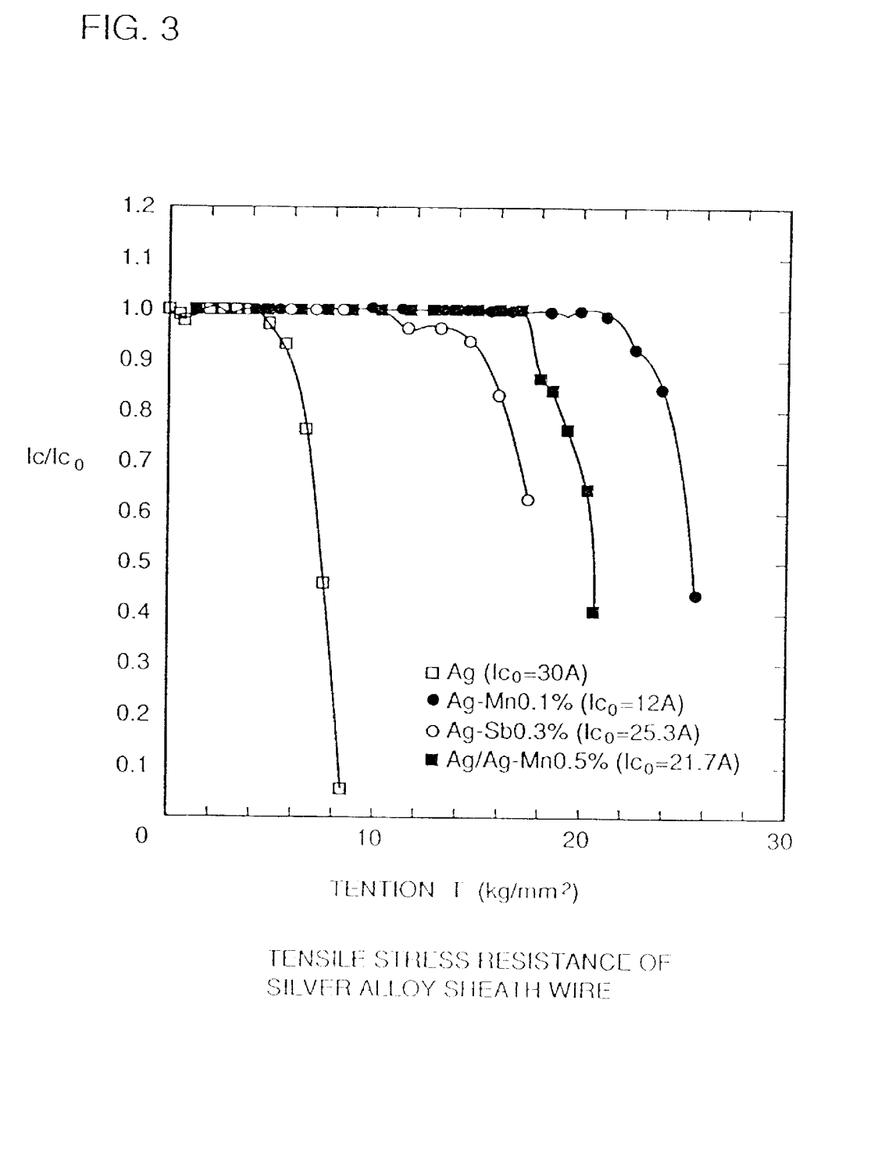
FIG. 3 illustrates tensile stress resistance values of wires obtained in Examples.
Figure 4:
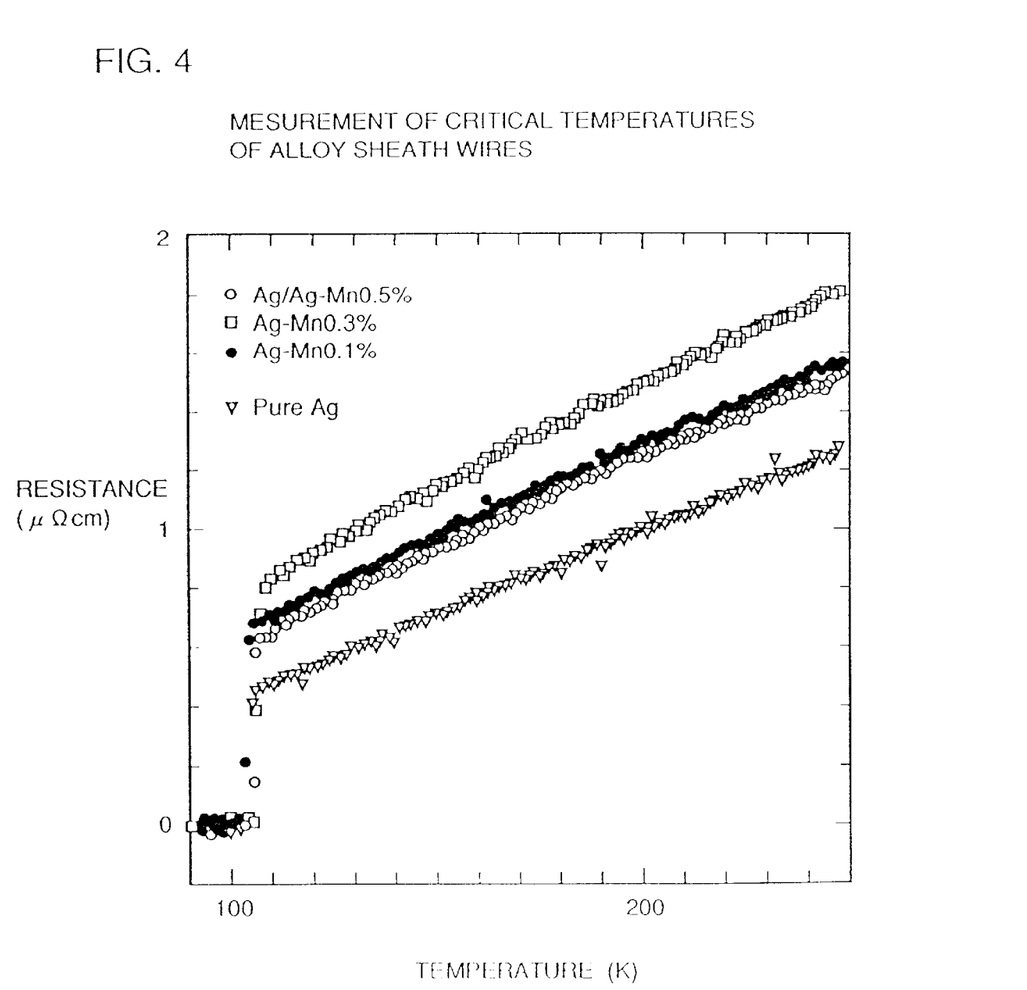
FIG. 4 illustrates relations between temperatures and specific resistance values as to the wires obtained in Examples.

As to some of the wires prepared in the aforementioned process, FIG. 3 shows tensile stress characteristics and FIG. 4 shows the results of measurement of the critical temperatures respectively. Referring to FIG. 3, the axis of abscissas shows tension (kg/mm$^2$), and the axis or ordinates shows the

TABLE 6

|  |  | For Charging | | For Engagement | | Tc | Jc | Specific Resistance | Yield Point |
|---|---|---|---|---|---|---|---|---|---|
|  | No. | Pb | Au | Pb | Au | (K) | (A/cm$^2$) | ($\mu\Omega$.cm) | (kg/mm$^2$) |
| Example | 1 | 0.01 | 0 | 0 | 0 | 109 | 23000 | 0.4 | 14.1 |
|  | 2 | 3 | 0 | 0 | 0 | 107 | 20000 | 2.5 | 22.3 |
|  | 3 | 5 | 0 | 0 | 0 | 105 | 19000 | 2.8 | 11.3 |
|  | 4 | 0.1 | 5 | 0 | 0 | 109 | 20000 | 1.7 | 16.4 |
|  | 5 | 0 | 0 | 0.01 | 0 | 110 | 22000 | 0.35 | 17.8 |
|  | 6 | 0 | 0 | 5 | 0 | 109 | 20000 | 2.0 | 23.5 |
|  | 7 | 0 | 0 | 2 | 3 | 110 | 21000 | 1.5 | 20.9 |
|  | 8 | 0 | 0 | 5 | 20 | 110 | 20000 | 3.3 | 21.0 |
| Comparative Example | 1 | 0 | 0 | 0 | 0 | 110 | 22000 | 0.23 | 4.0 |

EXAMPLE 15

Metal sheaths for charging powder and those for engaging strands were made of different materials respectively, to prepare wires similarly to Example 10. Table 7 shows combinations of the sheaths. As to the compositions of the sheaths, Table 7 shows only atomic percentages of the added elements, with the rests of silver. Primary and secondary heat treatments were carried out at 845° C. and 840° C. respectively. As to the obtained wires, critical temperatures (Tc) and critical current densities (Jc) in liquid nitrogen with no application of external magnetic fields were measured by a dc four-probe method. Further, specific resistance values at temperatures immediately above the critical temperatures were measured, while a tensile test was made at the room temperature in the aforementioned manner, to obtain yield points. Table 7 shows the results.

ratios (Ic/IcO) of critical currents with application of tension (Ic) to critical currents with application of no tension (IcO) respectively. Referring to this figure, "Ag", "Ag—Mn 0.1%" and "Ag—Sb 0.3%" indicate multifilamentary oxide superconducting wires employing the materials for sheaths for charging and engagement respectively, and "Ag/Ag—Mn 0.5%" indicates a multifilamentary oxide superconducting wire employing Ag and Ag—Mn 0.5% for the sheaths for charging and engagement respectively. All percentages are shown in atomic percent values. In the preparation process, the primary and secondary heat treatments were carried out in the atmosphere at 845° C. for 50 hours and at 840° C. for 50 hours respectively. FIG. 4 shows relations between temperatures (K) and resistance values ($\mu\Omega$cm) as to the respective wires.

The following experiments were further made with different sheath materials.

TABLE 7

|  |  | For Charging | | For Engagement | | Tc | Jc | Specific Resistance | Yield Point |
|---|---|---|---|---|---|---|---|---|---|
|  | No. | Bi | Au | Bi | Au | (K) | (A/cm$^2$) | ($\mu\Omega$.cm) | (kg/mm$^2$) |
| Example | 1 | 0.01 | 0 | 0 | 0 | 108 | 22000 | 0.4 | 10.1 |
|  | 2 | 0.3 | 0 | 0 | 0 | 106 | 20000 | 1.3 | 10.9 |
|  | 3 | 3 | 1 | 0 | 0 | 105 | 20000 | 3.0 | 13.2 |
|  | 4 | 4.8 | 0 | 0 | 0 | 105 | 20000 | 3.5 | 14.6 |
|  | 5 | 0 | 0 | 0.5 | 0 | 108 | 23000 | 1.2 | 8.4 |
|  | 6 | 0 | 0 | 3.0 | 0 | 109 | 23400 | 1.9 | 13.9 |
|  | 7 | 0 | 0 | 5.0 | 0 | 108 | 22000 | 2.8 | 14.4 |
|  | 8 | 0 | 0 | 3.0 | 5 | 109 | 23000 | 3.2 | 15.3 |
| Comparative Example | 1 | 0 | 0 | 0 | 0 | 110 | 22000 | 0.23 | 8.1 |

EXAMPLE 16

A sheath for charging powder was formed by a silver alloy sheath having inner and outer sides of Ag and an Ag—3 at. % Bi alloy respectively while a metal sheath for engagement was formed by an Ag sheath, to prepare a wire similarly to Example 15. The obtained wire exhibited a high critical temperature of 110 K, a high critical current density of 20,000 A/cm$^2$ and a high yield point of 13.0 kg/mm$^2$. Ac loss

EXAMPLE 17

$Bi_2O_3$, PbO, $SrCO_3$, $CaCO_3$ and CuO were blended with each other to obtain powder containing Bi, Pb, Sr, Ca and Cu in composition ratios of 1.8:0.4:2:2:3. This powder was heat treated at 700° C. for 12 hours, at 800° C. for 8 hours, and at 850° C. for 8 hours. The powder was pulverized by a ball mill, heat treated at 800° C. for 15 minutes for deaeration, and thereafter charged in silver alloy pipes of 12 mm$\phi$ in outer diameter and 10 mmφ in inner diameter. The compositions of the employed silver alloy pipes are shown as "inner side" in vertical columns in Tables 8 to 13, and as "first" in Table 14 respectively. The pipes were thereafter drawn into 1.02 mmφ, and the obtained wires were cut so that 61 wires were engaged in a silver alloy pipe of 12 mmφ in outer diameter and 9 mmφ in inner diameter every sample. The compositions of the employed alloy pipes are shown as "coat" in transverse rows in Tables 8 to 13, and as "second" in Table 14. These pipes were drawn into 1.15 mmφ, and thereafter rolled into 0.25 mm in thickness. The rolled wires were heat treated in the atmosphere at 845° C. for 50 hours respectively, and thereafter further rolled into 0.2 mm in thickness. Then, the wires were heat treated in the atmosphere at 840° C. for 50 hours respectively. As to the obtained wires, critical temperatures, specific resistance values at 115 K, and critical current densities (Jc) in liquid nitrogen under self magnetic fields were measured by a dc four-probe method. Further, a tensile test was made at the room temperature, to obtain yield points. Tables 8 to 14 show the results.

TABLE 8

| | | Coat | | |
|---|---|---|---|---|
| | Ag | Ag-0.3 at % Mg | Ag-0.3 at % Ni | Ag-0.3 Mg-0.5 Ni |
| Inner side | | | | |
| Ag | 30,000 | 32,000 | 30,000 | 31,000 |
| Ag-0.5 at % Sb | 31,000 | 33,000 | 30,000 | 31,000 |
| Ag-0.5 at % Zr | 33,000 | 31,000 | 28,000 | 29,000 |
| Ag-0.5 at % Ti | 34,000 | 35,000 | 30,000 | 30,000 |
| Ag-10 at % Au | 30,000 | 34,000 | 32,000 | 33,000 |

Jc(A/cm$^2$)

TABLE 9

| | | Coat | | |
|---|---|---|---|---|
| | Ag | Ag-0.3 at % Mg | Ag-0.3 at % Ni | Ag-0.3 Mg-0.5 Ni |
| Inner side | | | | |
| Ag-0.5 at % Sb | 0.50 | 0.55 | 0.55 | 0.60 |
| Ag-0.5 at % Zr | 0.60 | 0.65 | 0.65 | 0.65 |
| Ag-0.5 at % Ti | 0.60 | 0.62 | 0.63 | 0.65 |
| Ag-10 at % AU | 1.0 | 1.0 | 1.0 | 1.0 |

Specific Resistance ($\mu\Omega$cm)

TABLE 10

| | | Coat | | |
|---|---|---|---|---|
| | Ag | Ag-0.3 at % Mg | Ag-0.3 at % Ni | Ag-0.3 Mg-0.5 Ni |
| Inner side | | | | |
| Ag | 4.0 | 12.0 | 15.0 | 18.0 |
| Ag-0.5 at % Sb | 8.0 | 13.0 | 18.0 | 20.0 |
| Ag-0.5 at % Zr | 9.0 | 15.0 | 19.0 | 22.0 |
| Ag-0.5 at % Ti | 11.0 | 18.0 | 21.0 | 25.0 |
| Ag-10 at % AU | 6.0 | 13.0 | 16.0 | 19.0 |

Yield Point (kg/mm$^2$)

TABLE 11

| | Coat | | | |
|---|---|---|---|---|
| | Ag-0.5 at % Pb | Ag-0.6 at % Mn | Ag-1 at % Au-0.3 at % Sb | Ag-1 at % Au-0.3 at % Bi |
| Inner side | | | | |
| Ag | 35,000 | 30,000 | 33,000 | 30,000 |
| Ag-0.5 at % Sb | 38,000 | 32,000 | 33,000 | 31,000 |
| Ag 0.5 at % Zr | 37,000 | 35,000 | 35,000 | 30,000 |
| Ag-0.5 at % TI | 32,000 | 34,000 | 34,000 | 31,000 |
| Ag-10 at % Au | 31,000 | 33,000 | 33,000 | 33,000 |

Jc(A/cm$^2$)

TABLE 12

| | Coat | | | |
|---|---|---|---|---|
| | Ag-0.5 at % Pb | Ag-0.6 at % Mn | Ag-1 at % Au-0.3 at % Sb | Ag-1 at % Au-0.3 at % Bi |
| Inner side | | | | |
| Ag | 1.2 | 0.80 | 2.0 | 2.3 |
| Ag-0.5 at % Sb | 1.3 | 1.0 | 2.4 | 2.7 |
| Ag-0.5 at % Zr | 1.4 | 0.65 | 2.1 | 2.4 |
| Ag-0.5 at % Ti | 0.8 | 0.60 | 2.0 | 2.4 |
| Ag-10 at % Au | 3.0 | 1.1 | 2.5 | 2.8 |

Specific Resistance ($\mu\Omega$cm)

TABLE 13

| | Coat | | | |
|---|---|---|---|---|
| | Ag-0.5 at % Pb | Ag-0.6 at % Mn | Ag-1 at % Au-0.3 at % Sb | Ag-1 at % Au-0.3 at % Bi |
| Inner side | | | | |
| Ag | 8.0 | 15.0 | 16.0 | 21.0 |
| Ag 0.5 at % Sb | 13.0 | 17.0 | 20.0 | 23.0 |
| Ag-0.5 at % Zr | 15.0 | 18.0 | 21.0 | 25.0 |
| Ag-0.5 at % TI | 18.0 | 22.0 | 22.0 | 27.0 |
| Ag-10 at % Au | 9.0 | 17.0 | 17.0 | 22.0 |

Yield Point (kg/cm$^2$)

TABLE 14

| No. | Alloy Type (at %) First | Second | Tc(K) | Jc (A/cm$^2$) | Specific Resistance ($\mu\Omega$cm) | Yield Point (kg/mm$^2$) |
|---|---|---|---|---|---|---|
| 1 | Ag-01 at % Mn | Ag | 105 | 15,000 | 1.0 | 12.0 |
| 2 | Ag-1 at % Au-0.1 at % aMn | Ag | 105 | 16,000 | 2.30 | 12.0 |
| 3 | Ag-1 at % Au-0.5 at % Sb | Ag | 108 | 35,000 | 2.3 | 10.0 |
| 4 | Ag-0.5 at % Sb | Ag | 108 | 36,000 | 1.0 | 10.0 |
| 5 | Ag-0.2 at % Pb | Ag | 107 | 35,000 | 1.9 | 18.0 |
| 6 | Ag-0.2 at % Pb-1 at % Au | Ag | 107 | 33,000 | 3.0 | 18.0 |
| 7 | Ag-0.2 at % Bi-1 at % Au | Ag | 109 | 35,000 | 3.0 | 13.0 |
| 8 | Ag-1 at % Au-0.1 at % Mn | Ag-0.3 at % Ni | 105 | 18,000 | 2.3 | 12.0 |
| 9 | Ag-1 at % Au-0.5 at % Sb | Ag-0.3 at % Ni | 108 | 33,000 | 2.8 | 12.0 |
| 10 | Ag-0.5 at % Sb | Ag-0.3 at % Ni | 108 | 32,000 | 1.8 | 12.0 |
| 11 | Ag-0.2 at % Pb | Ag-0.3 at % Ni | 109 | 37,000 | 1.8 | 17.0 |
| 12 | Ag-0.2 at % Pb-1 at % Au | Ag-0.3 at % Ni | 109 | 35,000 | 2.8 | 14.0 |
| 13 | Ag-0.2 at % Bi-1 at % Au | Ag-0.3 at % Ni | 110 | 35,000 | 5.0 | 13.0 |

EXAMPLE 18

Materials similar to those in Example 17 were employed to prepare multifilamentary oxide superconducting wires through similar steps, except that heat treatments were carried out under oxygen partial pressures of 0.04 atm. As to the obtained wires, critical current densities (Jc) and specific resistance values at temperatures immediately above critical temperatures (Tc+1 K) were measured respectively. Table 15 shows the results. Sheath materials employed for preparing the samples Nos. 1 to 13 in Table 15 are identical to those shown in Table 14. Table 15 omits the description of the second sheath materials.

TABLE 15

| No. | Alloy Type (at %) | Tc(K) | Jc (A/cm$^2$) | Specific Resistance ($\mu\Omega$cm) |
|---|---|---|---|---|
| 1 | Ag-0.1 at % Mn | 105 | 22,000 | 1.8 |
| 2 | Ag-1 at % Au-0.1 at % Mn | 105 | 21,000 | 2.30 |
| 3 | Ag-1 at % Au-0.5 at % Sb | 108 | 37,000 | 2.3 |
| 4 | Ag-0.5 at % Sb | 108 | 38,000 | 3.5 |
| 5 | Ag-0.2 at % Pb | 107 | 35,000 | 3 |
| 6 | Ag-0.2 at % Pb-1 at % Au | 107 | 32,000 | 4.2 |
| 7 | Ag-0.2 at % Bi-1 at % Au | 109 | 38,000 | 3.8 |
| 8 | Ag-1 at % Au-0.1 at % Mn | 105 | 21,000 | 2.3 |
| 9 | Ag-1 at % Au-0.5 at % Sb | 108 | 34,000 | 3.5 |
| 10 | Ag-0.5 at % Sb | 108 | 33,000 | 3.0 |
| 11 | Ag-0.2 at % Pb | 109 | 37,000 | 2.4 |
| 12 | Ag-0.2 at % Pb-1 at % Au | 109 | 35,000 | 2.8 |
| 13 | Ag-0.2 at % Bi-1 at % Au | 110 | 35,000 | 5.0 |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oxide superconducting wire, comprising:

a stabilizing metal; and a filament consisting essentially of an oxide superconductor and being embedded in said stabilizing metal;

said stabilizing metal comprising a first portion directly covering said oxide superconductor and a second portion covering said first portion;

said first portion consisting essentially of an Ag—Sb alloy;

said second portion consisting essentially of such a silver alloy that at least either its mechanical strength or its specific electrical resistance is higher than that of silver;

said first and second portions comprising different materials; and said first portion being adapted to prevent the component of said second portion from diffusing into and reacting with said oxide superconductor;

wherein the first portion of the stabilizing metal entirely covers the oxide superconductor.

2. The oxide superconducting wire in accordance with claim 1, wherein said oxide superconducting wire is a multifilamentary wire having a plurality of said filaments.

3. The oxide superconducting wire in accordance with claim 1, wherein said second portion consists essentially of at least one alloy selected from the group consisting of an Ag—Mg alloy, an Ag—Ni alloy, an Ag—Mg—Ni alloy, an Ag—Zr alloy, and following alloys (A) to (G):

(A) an Ag—Mn alloy containing at least 0.01 at. % and less than 1 at. % of Mn in which a part of Mn is deposited in a solid solution as oxide particles;

(B) an Ag—Au—Mn alloy containing at least 1 at. % and not more than 30 at. % of Au and at least 0.01 at. % and less than 1 at. % of Mn in which a part of Mn is deposited in a solid solution as oxide particles;

(C) an Ag—Au—Sb alloy containing at least 1 at. % and not more than 30 at. % of Au and at least 0.01 at. % and not more than 5 at. % of Sb in which a part of Sb is deposited in a solid solution as oxide particles;

(D) an Ag—Pb alloy containing at least 0.01 at. % and not more than 3 at. % of Pb in which a part of Pb is deposited in a solid solution as oxide particles;

(E) an Ag—Au—Pb alloy containing at least 1 at. % and not more than 30 at. % of Au and at least 0.01 at. % and not more than 3 at. % of Pb in which a part of Pb is deposited in a solid solution as oxide particles;

(F) an Ag—Au—Bi alloy containing at least 1 at. % and not more than 30 at. % of Au and at least 0.01 at. % and not more than 3 at. % of Bi in which a part of Bi is deposited in a solid solution as oxide particles, and (G) an Ag—Bi alloy containing at least 0.01 at. % and not more than 3 at. % of Bi in which a part of Bi is deposited in a solid solution as oxide particles.

4. The oxide superconducting wire in accordance with claim 1, wherein said Ag—Sb alloy contains at least 0.01 at.

% and not more than 5 at. % of Sb in which a part of Sb is deposited in a solid solution as oxide particles.

5. The oxide superconducting wire in accordance with claim 1, wherein said second portion consists essentially of a silver alloy having higher mechanical strength and specific electrical resistance than those of silver.

6. The oxide superconducting wire in accordance with claim 5, wherein said second portion consists essentially of at least one alloy selected from the group consisting of an Ag—Mg alloy, an Ag—Ni alloy, an Ag—Mg—Ni alloy, an Ag—Zr alloy, and following alloys (A) to (G):

(A) an Ag—Mn alloy containing at least 0.01 at. % and less than 1 at. % of Mn in which a part of Mn is deposited in a solid solution as oxide particles;

(B) an Ag—Au—Mn alloy containing at least 1 at. % and not more than 30 at. % of Au and at least 0.01 at. % and less than 1 at. % of Mn in which a part of Mn is deposited in a solid solution as oxide particles;

(C) an Ag—Au—Sb alloy containing at least 1 at. % and not more than 30 at. % of Au and at least 0.01 at. % and not more than 5 at. % of Sb in which a part of Sb is deposited in a solid solution as oxide particles;

(D) an Ag—Pb alloy containing at least 0.01 at. % and not more than 3 at. % of Pb in which a part of Pb is deposited in a solid solution as oxide particles;

(E) an Ag—Au—Pb alloy containing at least 1 at. % and not more than 30 at. % of Au and at least 0.01 at. % and not more than 3 at. % of Pb in which a part of Pb is deposited in a solid solution as oxide particles;

(F) an Ag—Au—Bi alloy containing at least 1 at. % and not more than 30 at. % of Au and at least 0.01 at. % and not more than 3 at. % of Bi in which a part of Bi is deposited in a solid solution as oxide particles, and (G) an Ag—Bi alloy containing at least 0.01 at. % and not more than 3 at. % of Bi in which a part of Bi is deposited in a solid solution as oxide particles.

7. The oxide superconducting wire in accordance with claim 5, wherein said second portion consists essentially of an Ag—Mn alloy containing Mn in the range of 0.01 at. % to 5 at. % in which a part of Mn is deposited in a solid solution as oxide particles.

8. An oxide superconducting wire formed by a powder-in-tube method, comprising:

a stabilizing metal; and a filament consisting essentially of an oxide superconductor and being embedded in said stabilizing metal;

wherein said stabilizing metal comprises first and second portions which comprise different materials;

wherein said first portion consists essentially of an Ag—Sb alloy and directly covers said oxide superconductor, said first portion being adapted to prevent the component of said second portion from diffusing into and reacting with said oxide superconductor;

wherein said second portion covers said first portion and consists essentially of such a silver alloy that at least either its mechanical strength or its specific electrical resistance is higher than that of silver; and wherein the first portion of the stabilizing metal entirely covers the oxide superconductor.

* * * * *

UNITED STATES PATENT AND TRADEMARK OFFICE
CERTIFICATE OF CORRECTION

PATENT NO. : 6,469,253 B1
DATED : October 22, 2002
INVENTOR(S) : Nobuhiro Saga, Kazuhiko Hayashi, and Kenichi Sato It is certified that error appears in the above-identified patent and that said Letters Patent is hereby corrected as shown below:

<u>Title page, Item [54], and Column 1,line 2,</u>

Please change the title "OXIDE SUPERCONDUCTING WIRE WITH STABILZING METAL HAVE NONE NOBLE COMPONENT" to -- OXIDE SUPERCONDUCTING WIRE WITH STABILZING METAL HAVING NONE NOBLE COMPONENT --.

Signed and Sealed this

Eleventh Day of March, 2003

JAMES E. ROGAN
*Director of the United States Patent and Trademark Office*